US012740224B2

(12) United States Patent
Gao et al.

(10) Patent No.: US 12,740,224 B2
(45) Date of Patent: Sep. 15, 2026

(54) LIGHT-EMITTING DEVICE, DISPLAY PANEL, AND DISPLAY DEVICE

(71) Applicant: BOE TECHNOLOGY GROUP CO., LTD., Beijing (CN)

(72) Inventors: Rongrong Gao, Beijing (CN); Kun Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1121 days.

(21) Appl. No.: 17/788,219

(22) PCT Filed: May 26, 2021

(86) PCT No.: PCT/CN2021/096029
§ 371 (c)(1),
(2) Date: Jun. 22, 2022

(87) PCT Pub. No.: WO2021/238975
PCT Pub. Date: Dec. 2, 2021

(65) Prior Publication Data

US 2023/0100815 A1 Mar. 30, 2023

(30) Foreign Application Priority Data

May 29, 2020 (CN) ......................... 202010479575.1

(51) Int. Cl.
*H01L 51/50* (2006.01)
*H01L 51/00* (2006.01)
(Continued)

(52) U.S. Cl.
CPC ............. *H10K 50/11* (2023.02); *H10K 50/15* (2023.02); *H10K 50/16* (2023.02); *H10K 50/171* (2023.02);
(Continued)

(58) Field of Classification Search
None
See application file for complete search history.

(56) References Cited

U.S. PATENT DOCUMENTS

2017/0320855 A1* 11/2017 Wong ................. H10K 85/6572
2019/0103567 A1 4/2019 Kim et al.

FOREIGN PATENT DOCUMENTS

CA 3080875 A1 * 5/2019
CN 106972109 A * 7/2017
(Continued)

OTHER PUBLICATIONS

Yu Kusakabe et al., Conformation control of iminodibenzyl-based thermally activated delayed fluorescence material by tilted face-to-face alignment with optimal distance (tFFO) design, Frontiers in Chemistry, vol. 8, Article 530, Aug. 2020, pp. 1-9.
(Continued)

*Primary Examiner* — Tae H Yoon
(74) *Attorney, Agent, or Firm* — XSENSUS LLP

(57) ABSTRACT

A light-emitting device includes a first electrode, a second electrode and a light-emitting layer arranged between the first electrode and the second electrode. The light-emitting layer includes a thermally activated delayed fluorescence (TADF) material, and the TADF material includes a donor, an acceptor, and a linking group connected between the donor and the acceptor. The donor includes a donor base unit, and a substituent connected to the donor base unit, and atoms in the donor base unit are located in a first plane. The acceptor includes an acceptor base unit, and a substituent connected to the acceptor base unit, and atoms in the acceptor base unit are located in a second plane. The linking group includes a linking base unit, and a substituent connected to the linking base unit, and atoms in the linking base unit are located in a third plane.

17 Claims, 6 Drawing Sheets

(51) Int. Cl.

| | |
|---|---|
| ***H01L 51/52*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/85*** | (2023.01) |
| ***H10K 85/60*** | (2023.01) |
| *H10K 101/10* | (2023.01) |

(52) U.S. Cl.

CPC ........... *H10K 50/85* (2023.02); *H10K 85/654* (2023.02); *H10K 85/6572* (2023.02); *H10K 2101/10* (2023.02)

(56) References Cited

FOREIGN PATENT DOCUMENTS

| | | | | |
|---|---|---|---|---|
| CN | 109585664 | A | | 4/2019 |
| CN | 109651392 | A | * | 4/2019 |
| CN | 110407829 | A | | 11/2019 |
| CN | 111592527 | A | | 8/2020 |
| JP | 6701649 | B2 | | 5/2020 |
| KR | 20200006569 | A | * | 1/2020 |
| WO | WO 2018/216820 | A1 | * | 11/2018 |
| WO | WO 2019/086668 | A1 | * | 5/2019 |

OTHER PUBLICATIONS

Wenliang Huang et al., Large Increase in External Quantum Efficiency by Dihedral Angle Tuning in a Sky-Blue Thermally Activated Delayed Fluorescence Emitter, Advanced Optical Material, vol. 7, 1900476, 2019, pp. 1-6.

Decision of Rejection issued by the Chinese patent Office for Application No. 202010479575.1 on Mar. 9, 2021.

First Office Action Issued by the Chinese Patent Office for Application No. 202010479575.1 on Dec. 22, 2020.

* cited by examiner

LIGHT-EMITTING DEVICE, DISPLAY PANEL, AND DISPLAY DEVICE

CROSS-REFERENCE TO RELATED APPLICATIONS

The present disclosure is a national phase entry under 35 USC 371 of International Patent Application No. PCT/CN2021/096029, filed on May 26, 2021, which claims priority to Chinese Patent Application No. 202010479575.1, filed on May 29, 2020, which are incorporated herein by reference in their entirety.

TECHNICAL FIELD

The present disclosure relates to the field of display technologies, and in particular, to a light-emitting device, a display panel, and a display device.

BACKGROUND

With the rapid development of science and technology and the continuous progress of display technology, organic light-emitting diode (OLED) display technology has also been rapidly developed. OLED display panels are increasingly used in display devices and have become the current mainstream development trend due to their advantages of ultra-thin, high brightness, large viewing angle, low power consumption, fast response, high color saturation, bendable and foldable, narrow bezel, high luminous efficiency and wide temperature adaptation range, etc.

SUMMARY

In an aspect, a light-emitting device is provided. The light-emitting device includes a first electrode and a second electrode that are stacked, and a light-emitting layer disposed between the first electrode and the second electrode. A material of the light-emitting layer includes a thermally activated delayed fluorescence (TADF) material. The TADF material includes a donor, an acceptor, and a linking group connected between the donor and the acceptor. The donor includes a donor base unit and a substituent connected to the donor base unit, and atoms in the donor base unit are located in a first plane. The acceptor includes an acceptor base unit and a substituent connected to the acceptor base unit, and atoms in the acceptor base unit are located in a second plane. The linking group includes a linking base unit and a substituent connected to the linking base unit, and atoms in the linking base unit are located in a third plane.

The donor is of one of structures shown in formula (I).

(I)

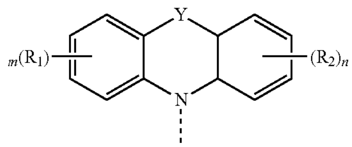

The acceptor is of one of structures shown in formula (II).

(II)

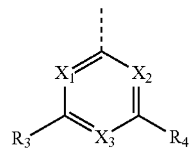

The linking group is any one of substituted or unsubstituted divalent aryl, substituted or unsubstituted divalent heteroaryl, substituted or unsubstituted divalent fused aryl, and substituted or unsubstituted divalent fused heteroaryl. Y is selected from a combination of one or more of a single bond, substituted or unsubstituted divalent alkyl, substituted or unsubstituted divalent aryl, substituted or unsubstituted divalent heteroaryl. R1 and R2 are each independently any one of alkyl, aryl, heteroaryl, fused aryl, and fused heteroaryl that are substituted or unsubstituted respectively; m and n are each a positive integer from 0 to 3. X1, X2 and X3 are each independently selected from any one of C, R and N, and at least one thereof is N. R3, R4 and R are each independently any one of hydrogen, cyano, aryl, heteroaryl, fused aryl and fused heteroaryl. Dotted lines in the formula (I) and the formula (II) each represent a linking bond connected to the linking group.

In some embodiments, a value of an included angle between the first plane and the third plane is in a range of 50° to 80°, inclusive.

In some embodiments, a value of an included angle between the second plane and the third plane is in a range of 0° to 80°, inclusive.

In some embodiments, an energy level difference between singlet excitons and triplet excitons in the TADF material is less than 0.2 eV.

In some embodiments, the donor is of any one of structures shown in Formulas 1 to 4.

Formula 1

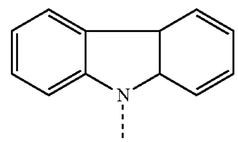

Formula 2

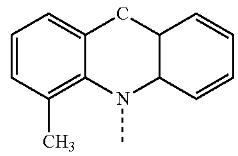

Formula 3

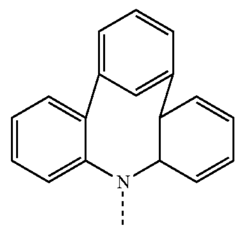

-continued

Formula 4

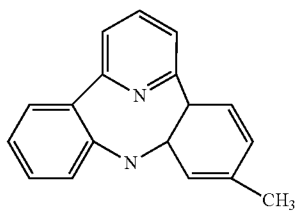

In some embodiments, the acceptor is of any one of structures shown in Formulas 5 to 8.

Formula 5

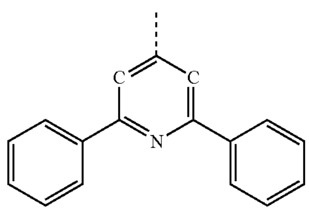

Formula 6

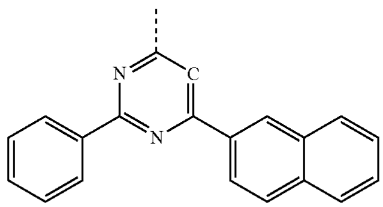

Formula 7

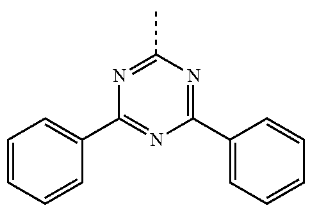

Formula 8

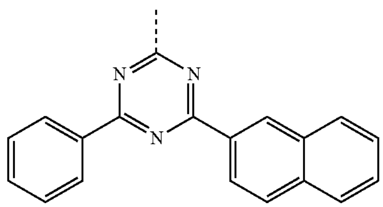

In some embodiments, the linking group is of any one of structures shown in Formulas 9 to 12.

Formula 9

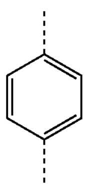

-continued

Formula 10

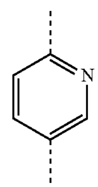

Formula 11

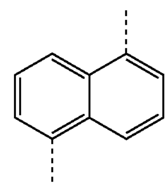

Formula 12

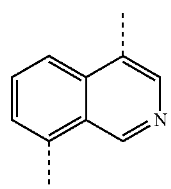

In some embodiments, the TADF material has a structure shown in any one of Compounds 1 to 4.

Compound 1

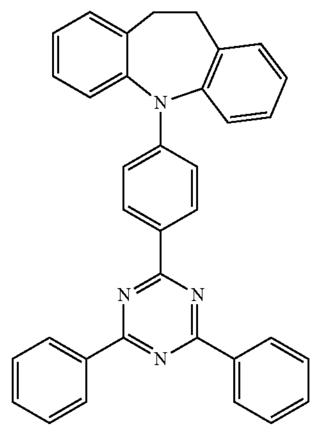

Compound 2

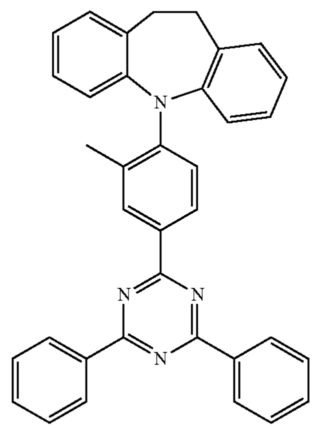

-continued

Compound 3

Compound 4

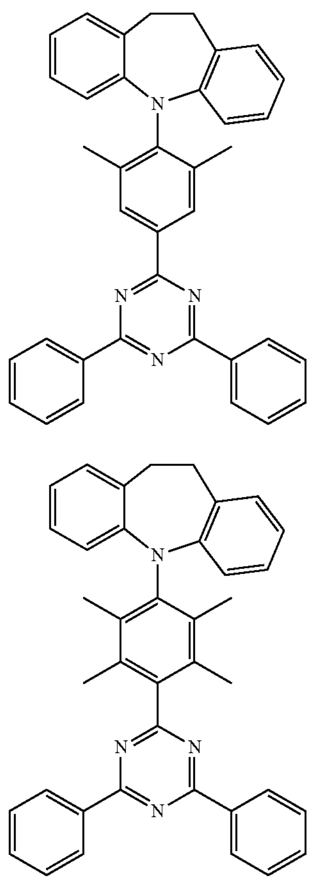

In some embodiments, the material of the light-emitting layer includes a host material and a guest material. The TADF material serves as the host material, and the guest material is of any one of structures shown in Formulas 13 to 15.

Formula 13

Formula 14

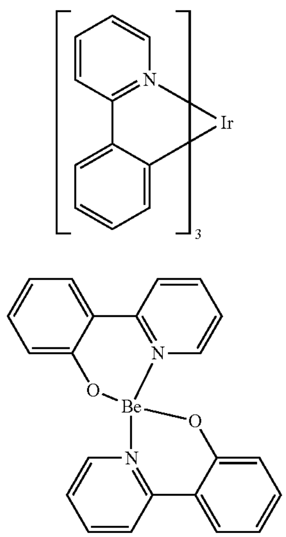

-continued

Formula 15

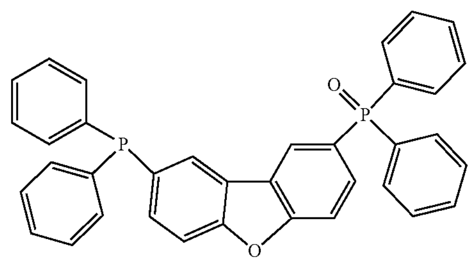

In some embodiments, the guest material is of the structure shown in Formulas 15, a ratio between a mass of the TADF material to a mass of the guest material is within a range of 80:20 to 99:1, inclusive.

In some embodiments, a mass proportion of the guest material in the light-emitting layer is within a range of 1% to 10%, inclusive.

In some embodiments, a difference between energy of triplet excitons of the host material and energy of triplet excitons of the guest material is greater than or equal to 0.65 eV.

In some embodiments, the light-emitting device further includes at least one of an electron injection layer, an electron transport layer, an electron barrier layer, a hole barrier layer, a hole transport layer and a hole injection layer.

In some embodiments, the light-emitting device further includes a light extraction layer disposed on the light-emitting layer away from the first electrode or the second electrode.

In some embodiments, a material of the electron injection layer is lithium fluoride (LiF), ytterbium (Yb) or is of a structure shown in Formula 16.

Formula 16

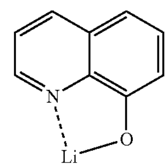

A material of the electron transport layer is of a structure shown in any one of Formulas 17 to 20.

Formula 17

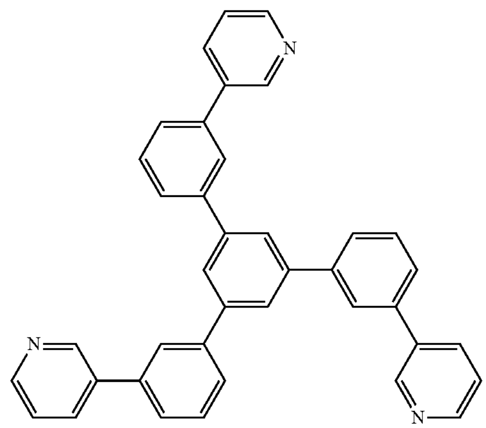

-continued
Formula 18
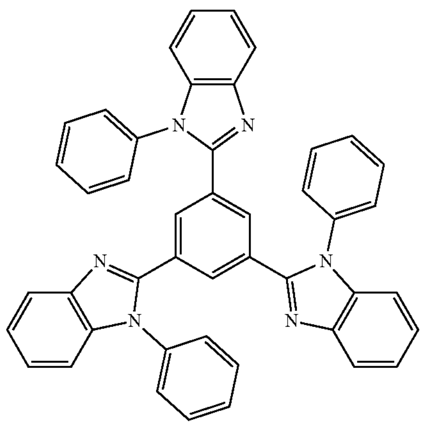
Formula 19
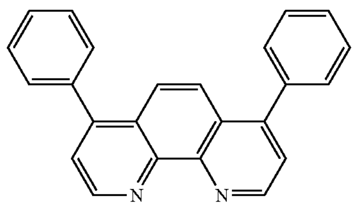
Formula 20
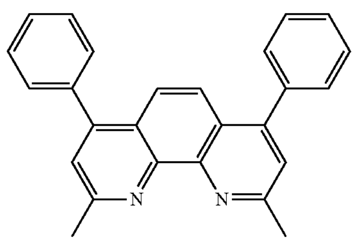
A material of the electron transport layer is of a structure shown in any one of Formulas 21 to 22.
Formula 21
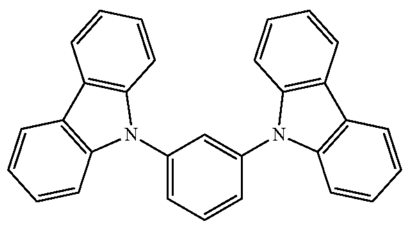
-continued
Formula 22
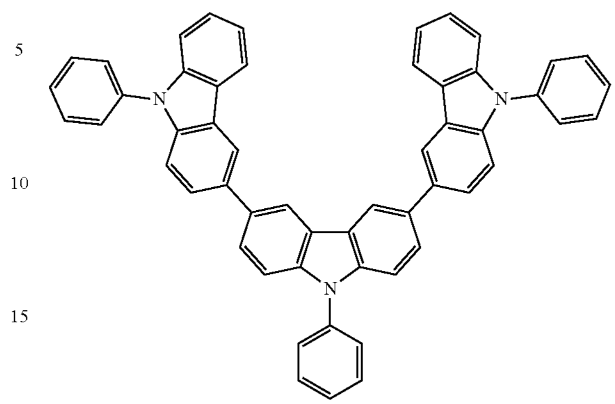
A material of the hole barrier layer is of a structure shown in any one of Formulas 18 to 20.
A material of the hole transport layer is of a structure shown in any one of Formulas 23 to 25.
Formula 23
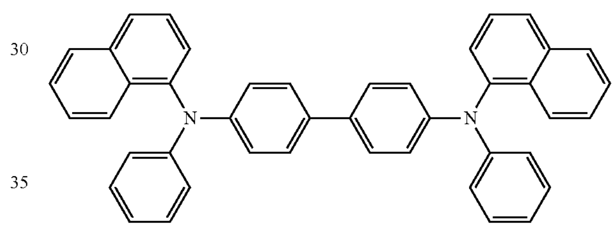
Formula 24
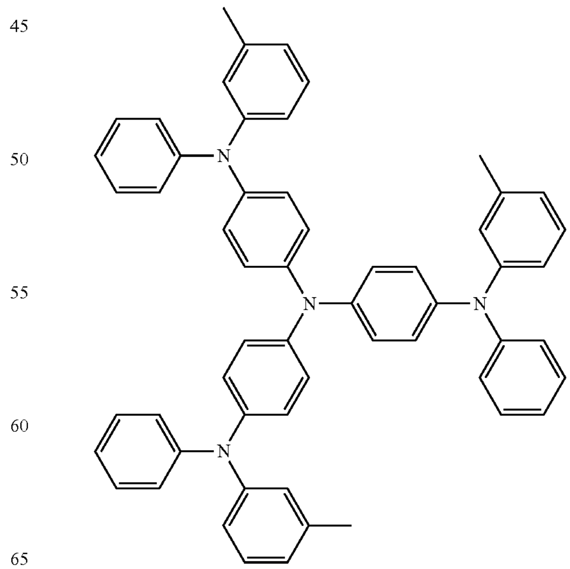

-continued

Formula 25

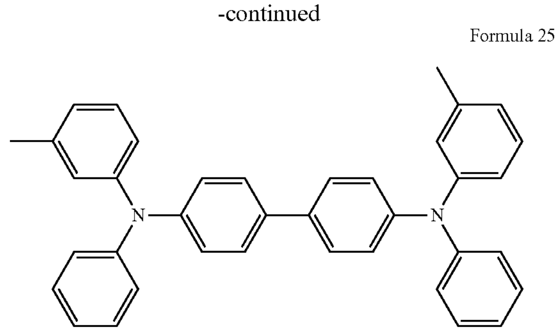

A material of the hole injection layer is of a structure shown in any one of Formulas 26 to 27.

Formula 26

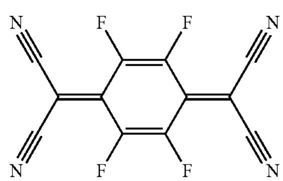

Formula 27

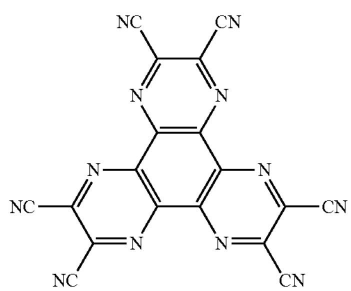

In another aspect, a display panel is provided. The display panel includes a base substrate and the light-emitting device disposed on the base substrate according to any one of the above embodiments.

In yet another aspect, a display device is provided. The display device includes the display panel described above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

DETAILED DESCRIPTION

Figure 1:
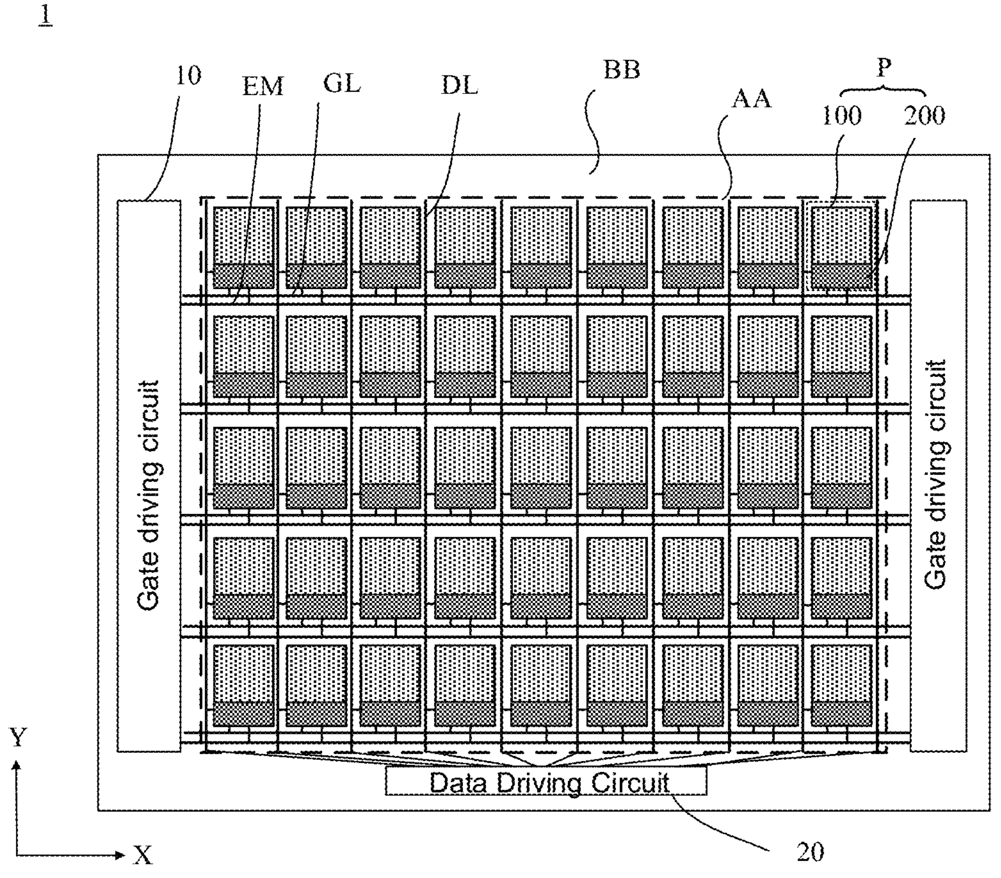
FIG. 1 is a structural diagram of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more features. In the description of the embodiments of the present disclosure, unless otherwise specified, the term "a plurality of" or "the plurality of" means two or more.

In the description of some embodiments, terms such as "coupled" and "connected" and derivatives thereof may be used. For example, the term "connected" may be used in the description of some embodiments to indicate that two or more components are in direct physical or electrical contact with each other. For another example, the term "connected" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "upon" or "in response to determining" or "in response to detecting" depending on the context. Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, the term such as "about", "substantially" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of regions in a device, and are not intended to limit the scope of the exemplary embodiments.

In some embodiments of the present disclosure, a display device is provided. The display device may be a television, a mobile phone, a computer, a notebook computer, a tablet computer, a personal digital assistant (PDA), or a vehicle-mounted computer, etc., which is not limited in the present disclosure. The display device may include a display panel, a circuit board, a display drive integrated circuit (IC) and other electronic accessories.

The display device may be an organic light-emitting diode (OLED) display device, and in this case, the display panel is an OLED display panel. As a current-type light-emitting device, OLED has been increasingly used in the field of high-performance displays due to its characteristics such as self-luminescence, fast response, wide viewing angle, and an ability to be fabricated on a flexible substrate, etc.

Figure 2:
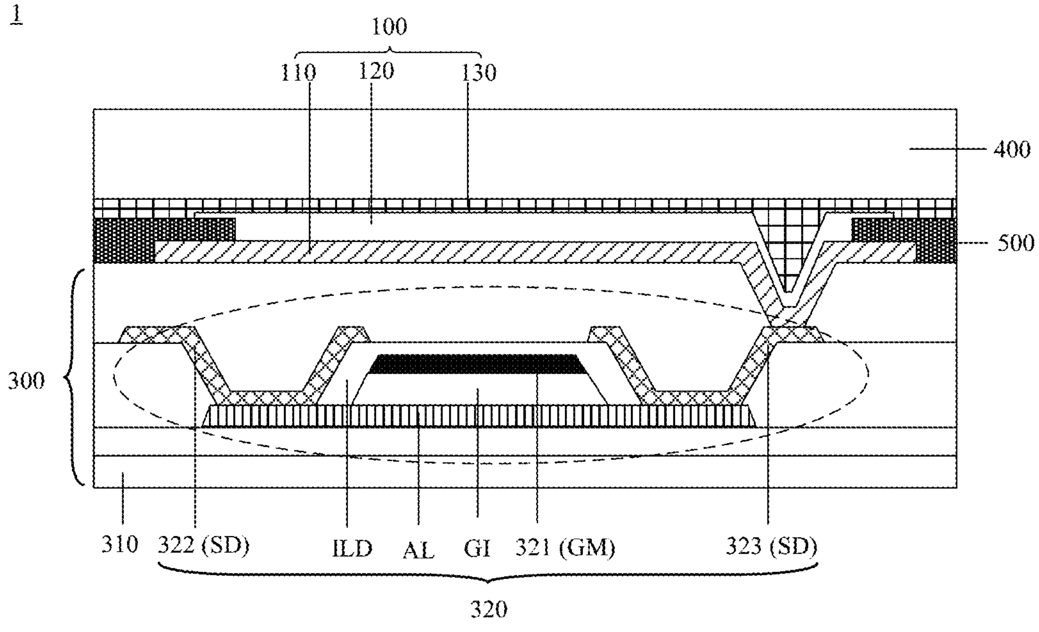
FIG. 2 is a sectional view of a display panel, in accordance with some embodiments.

As shown in FIG. 1, observing from a viewing angle directly facing a display surface of the display panel 1, it can be seen that the display panel 1 has a display area AA and a peripheral area BB located on at least one side of the display area AA. FIG. 2 illustrates an example where the peripheral area BB surrounds the display area AA, which is not limited thereto in the present disclosure.

On this basis, as shown in FIG. 1, the display panel 1 includes a plurality of sub-pixels P located in the display area AA. Each sub-pixel P includes a pixel circuit 200 and a light-emitting device 100 electrically connected to the pixel circuit 200. The pixel circuit 200 drives the light-emitting device 100 to emit light. Light-emitting devices in the plurality of sub-pixels P may at least emit light of three primary colors, such as red (R) light, green (G) light and blue (B) light.

For convenience of description, the embodiments of the present disclosure are described by considering an example in which the plurality of the sub-pixels P are arranged in a matrix form. In this case, sub-pixels P arranged in a line in a horizontal direction X are referred to as sub-pixels in a same row, and sub-pixels P arranged in a line in a vertical direction Y are referred to as sub-pixels in a same column.

As shown in FIG. 1, pixel circuits 200 located in a same row are electrically connected to a same emission control signal line EM, and are further electrically connected to a same gate signal line GL. Pixel circuits 200 in a same column are electrically connected to a same data signal line DL.

The peripheral area BB is provided with gate driving circuits 10 and a data driving circuit 20 therein. The gate driving circuits 10 supply the pixel circuits 200 with progressive scanning gate signals through the plurality of gate signal lines GL. Under the gating of the gate signals, data signals provided by the data driving circuit 20 can be input into the gated pixel circuits 200 through the plurality of data signal lines DL. The gate driving circuit 10 further provides light-emitting signals to the pixel circuits 200 in the display area AA through a plurality of emission control signal lines EM. The pixel circuit 200 drives the light-emitting device 100 electrically connected thereto to emit light under a joint action of the gate signals, the light-emitting signals and the data signals.

Film layers used to form transistors in the gate driving circuit 10 and transistors in the pixel circuits 200 may be formed by using a same patterning process. In this way, the gate driving circuits 10 are integrated on the base substrate when the pixel circuits 200 are manufactured on a same base substrate, so that an IC bonding process is omitted, and the cost is reduced. Moreover, designs of narrow bezel and low power consumption are achieved.

The typical patterning process refers to a process of applying a mask for one time to form a desired pattern, and the process includes: coating a surface of a film with a photoresist, exposing the photoresist, developing after exposure, etching a region of the film exposed by the photoresist to form specific pattern(s), and removing the photoresist.

Hereinafter, an internal structure of the display panel 1 will be exemplified. It will be noted that, since a structure corresponding to each sub-pixel P in the display panel 1 is basically the same, FIG. 2 is descripted by taking an example in which only a structure corresponding to a sub-pixel P in FIG. 1.

As shown in FIG. 2, the display panel 1 includes a base substrate 300, and a light-emitting device 100 disposed on the base substrate 300. The base substrate 300 may be of a single-layered structure or a laminated structure. In some embodiments, the base substrate 300 includes a blank base 310, and a pixel circuit 200 disposed on the blank base 310.

As shown in FIG. 2, the pixel circuit 200 includes at least one thin film transistor (TFT) 320 and at least one capacitor (not shown in FIG. 2). Each thin film transistor 320 may be of a top-gate or bottom-gate structure. FIG. 2 is descripted by considering an example where the thin film transistor 320 is of the top-gate structure. As shown in FIG. 2, the thin film transistor 320 includes an active layer AL, a gate insulating layer GI, a gate metal layer GM (which for forming a gate 321), an interlayer dielectric layer ILD and a source-drain metal layer SD (which for forming a source 322 and a drain 323) that are disposed on the blank base 310 in sequence. The gate 321 receives the gate signal transmitted by the gate signal line GL, so that the data signal is input into the source 322 or the drain 323 of the thin film transistor 320 through the data signal line DL under the gating of the gate signal.

It will be noted that, the active layer AL may be made of amorphous silicon, monocrystalline silicon, polycrystalline silicon or oxide semiconductor. The blank base 310 may be a flexible blank base or a rigid blank base. In a case where the blank base 310 is a flexible blank base, a material of the blank base 310 may be polyethylene terephthalate (PET), polyethylene naphthalate two formic acid glycol ester (PEN) or polyimide (PI), etc. In a case where the blank base 310 is a rigid blank base, a material of the blank base 310 may be glass or polymethyl methacrylate (PMMA), etc.

As shown in FIG. 2, the display panel 1 further includes a pixel definition layer 500 disposed on a side of the thin film transistor 320 away from the blank substrate 310. The pixel definition layer 500 includes a plurality of opening regions and a barrier wall arranged around the opening regions. A single light-emitting device 100 is disposed in a single opening region. First electrodes 110 and light-emitting layers 120 of adjacent light-emitting devices 100 are separated respectively by the barrier wall of the pixel definition layer 500.

As shown in FIG. 2, the display panel 1 further includes an encapsulation layer 400. The encapsulation layer 400 may prevent moisture and oxygen from immersing the plurality of light-emitting devices 100. The encapsulation layer 400 may be an encapsulation film or an encapsulation substrate.

In a case where the encapsulation layer 400 is an encapsulation film, the encapsulation layer 400 may include a single layer of encapsulation film, or may include two or more layers of encapsulation films which are stacked. For example, the encapsulation layer 400 includes three layers of encapsulation films that are sequentially stacked. An encapsulation film located in an intermediate layer is made of an organic material, and encapsulation films located on both sides are made of an inorganic material. For example, the organic material may be PMMA, and the inorganic material may be one or more of silicon nitride ($SiN_x$), silicon oxide ($SiO_x$), and silicon oxynitride ($SiO_xN_y$).

Figure 3:
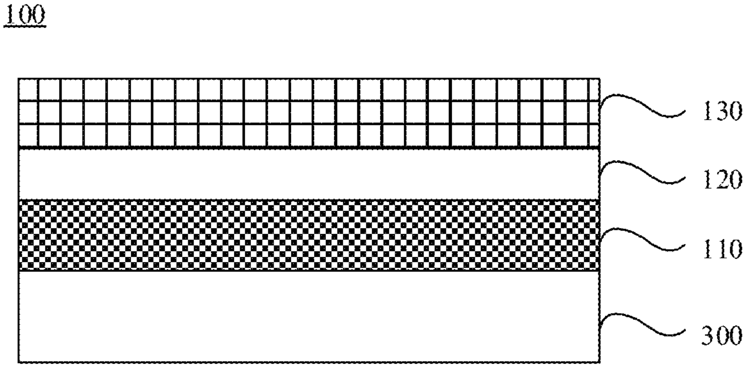
FIG. 3 is a structural diagram of a light-emitting device, in accordance with some embodiments.

As shown in FIG. 3, some embodiments of the present disclosure provide a light-emitting device 100. The light-emitting device 100 includes a first electrode 110, a light-emitting layer 120 and a second electrode 130 that are disposed on the base substrate 300 in sequence. In some embodiments, the first electrode 110 may be an anode (for supplying holes), and the second electrode 130 may be a cathode (for supplying electrons). In some other embodiments, the first electrode 110 may be a cathode, and the second electrode 130 may be an anode. For convenience of explanation, the following embodiments will all be described by considering an example in which the first electrode 110 is an anode, and the second electrode 130 is a cathode. On this basis, due to an action of an electric field, the holes generated by the first electrode 110 and the electrons generated by the second electrode 130 move to the light-emitting layer 120. When the holes and the electrons meet in the light-emitting layer 120, they combine to generate excitons, and the excitons are de-excited to generate light.

The first electrode 110 may be formed of a metal with high reflectivity, and the second electrode 130 may be formed of a transparent conductive film. In this case, light emitted by the light-emitting layer 120 is reflected by the first electrode 110, and then exits through the second electrode 130, thereby forming a top-emission type light-emitting device. Alternatively, the first electrode 110 is formed of a transparent conductive film, and the second electrode 130 is formed of a metal with high reflectivity, thereby forming a bottom-emission type light-emitting device. Of course, in a case where the first electrode 110 and the second electrode 130 are both formed of a transparent conductive film, a double-sided-emission type light-emitting device may be formed.

Figure 4:
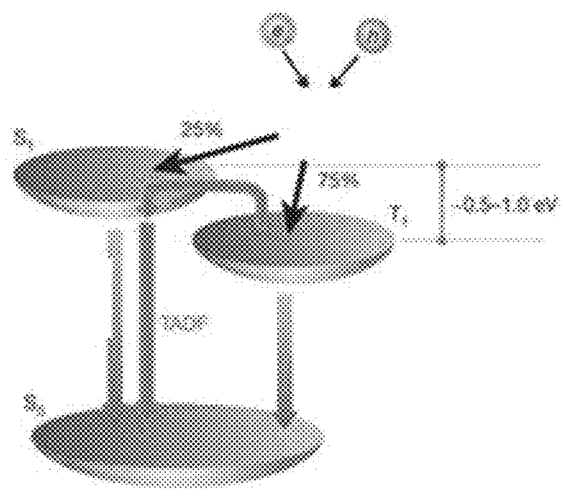
FIG. 4 is a diagram showing a light-emitting principle of a light-emitting device, in accordance with some embodiments.

A material of the transparent conductive film may be indium tin oxide (ITO), indium zinc oxide (IZO) or indium gallium zinc oxide (IGZO), etc. The metal with high reflectivity may be, for example, silver (Ag). In some embodiments, the light-emitting layer 120 includes a thermally activated delayed fluorescence (TADF) material. Delayed fluorescence results from the radiation transition of regenerating S1 state from a triplet excited state T1 (as shown in FIG. 4). Based on different luminous mechanisms, the delayed fluorescence may include P-type delayed fluorescence and E-type delayed fluorescence. For P-type delayed fluorescence, as shown in FIG. 4, an energy level difference between singlet excitons and triplet excitons is large, which may be within a range of 0.5 eV to 1 eV, inclusive. For E-type delayed fluorescence (also known as thermally activated delayed fluorescence (TADF)), the energy of triplet excitons is close to that of singlet excitons, and the triplet excitons may be converted into singlet excitons through reverse intersystem crossing due to thermal activation, and a material that can emit thermally activated delayed fluorescence is the TADF material.

In a case where the TADF material is directly used as a fluorescent luminescent material, compared with a fluorescent luminescent material of a non-TADF material, the energy of the triplet excitons may be fully utilized to improve the luminescent efficiency; compared with a noble metal complex of the related art as the luminescent material, the cost may be reduced and the noble metal pollution may be reduced.

In some embodiments, a material of the light-emitting layer 120 includes a host material and a guest material. The TADF material serves as the guest material, and the host material may include one of 4,4',4"-Tris(carbazol-9-yl)-triphenylamine (TCTA), N,N'-Dimethylquinacridone (DMQA), triphenylamine (TPA), and coumarin derivatives (mEMCB). By adopting a host-guest doping system, the energy transfer between the host and the guest materials may be achieved through an energy level matching between the host and guest materials, which may further improve the exciton utilization efficiency, thereby further improving the luminescent efficiency.

In some other embodiments, an example is taken in which the material of the light-emitting layer 120 includes a host material and a guest material. The TADF material serves as the host material, and the guest material may be a structure shown in any one of the following Formulas 13 to 15.

Formula 13

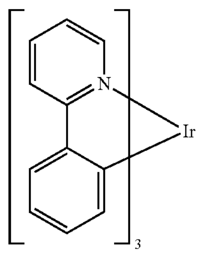

Formula 14

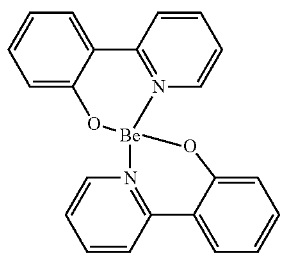

Formula 15

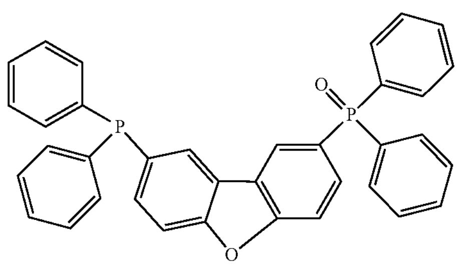

In these embodiments, TADF serves as the host material, compared with a situation where a non-TADF material serves as the host material in the related art, energy may be transferred to the guest material more efficiently.

Figure 5:
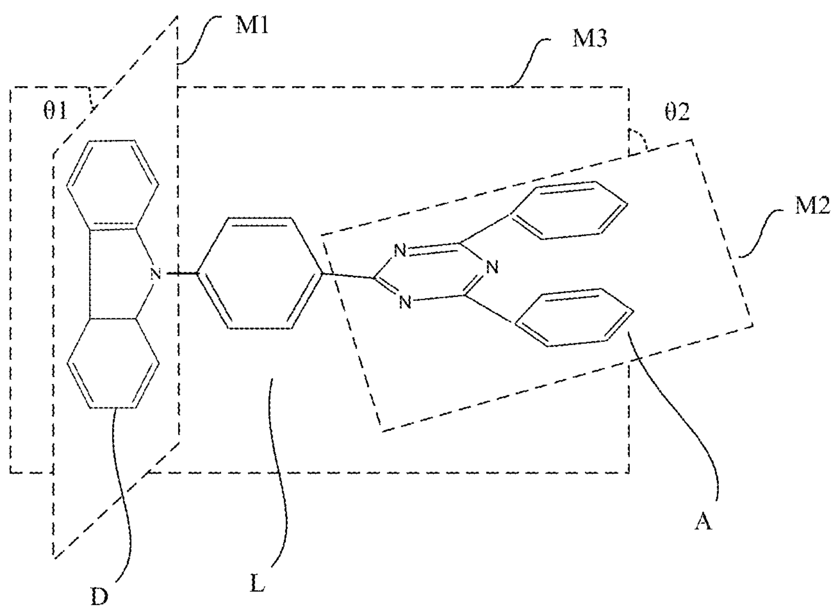
FIG. 5 is a schematic diagram showing an angle between D and L and an angle between L and A in a thermally activated delayed fluorescence (TADF) material, in accordance with some embodiments.

In some embodiments, as shown in FIG. 5, the TADF material includes a donor D, an acceptor A, and a linking group L connected between the donor D and the acceptor A, and the TADF material may be of a D-L-A structure.

The donor includes a donor base unit and a substituent connected to the donor base unit. Each atom in the donor base unit is located in a first plane M1. The donor is of one of structures shown in the following formula (I), and the dotted line connected to N represents a linking bond connected to the linking group L.

(I)

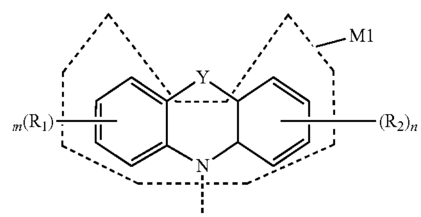

In formula (I), the donor base unit is represented by the dashed box. That is, no matter what groups Y, R1 and R2 that serving as substituents in formula (I) are, atoms in the dashed box are located in a same plane (i.e., the first plane M1).

In some embodiments, Y is selected from a combination of one or more of a single bond, substituted or unsubstituted divalent alkyl, substituted or unsubstituted divalent aryl, and substituted or unsubstituted divalent heteroaryl. R1 and R2 are each any one of alkyl, aryl, heteroaryl, fused aryl, and fused heteroaryl that are substituted or unsubstituted respectively. m and n are each a positive integer from 0 to 3.

Here, in a case where Y is the single bond, formula (I) is carbazolyl, and is shown in following Formula 1 below. In a case where Y is divalent alkyl, divalent alkyl may be $-CH_2-$ or $-CH_2-CH_2-$, and the Formula 2 shows the case where divalent alkyl is $-CH_2-$. In a case where Y is divalent aryl, Y may be phenylene as shown in the following Formula 3. In a case where Y is divalent heteroaryl, Y may be pyridylene as shown in the following Formula 4.

Formula 1

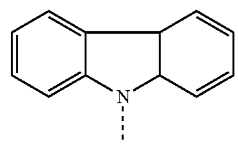

Formula 2

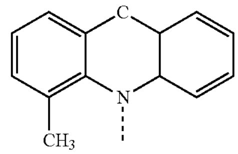

Formula 3

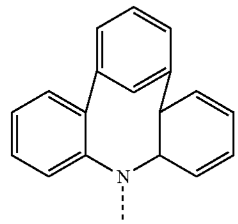

Formula 4

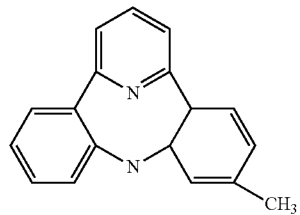

The acceptor includes an acceptor base unit and a substituent connected to the acceptor base unit. Atoms in the acceptor base unit are located in a second plane M2 (as shown in FIG. 5). The acceptor is of the structure shown in the following formula (II), and the dotted line in the following formula (II) represents a linking bond connected to the linking group L.

(II)

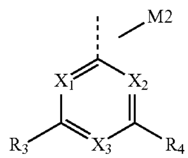

X1, X2 and X3 are each independently selected from any one of C(R) and N, and at least one thereof is N. R, R3 and R4 are the same or different, and R3, R4 and R are each independently any one of hydrogen, cyano, aryl, heteroaryl, fused aryl and fused heteroaryl.

Here, in a case where X1 and X2 are each C, X3 is N, and R3 and R4 are each aryl, the acceptor is shown in the following Formula 5. In a case where X1 and X3 are each N, X2 is C, R3 is aryl, and R4 is fused aryl, the acceptor is shown in the following Formula 6. In a case where X1, X2 and X3 are each N, and R3 and R4 are each aryl, the acceptor is shown in the following Formula 7. In a case where X1, X2 and X3 are each N, R3 is aryl, and R4 is fused aryl, the acceptor is shown in the following Formula 8.

Formula 5

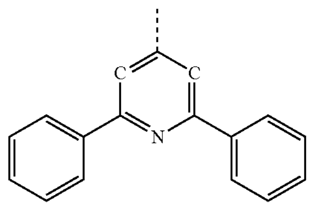

Formula 6

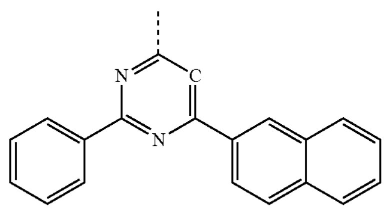

Formula 7

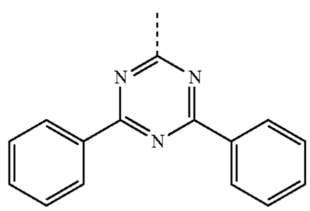

Formula 8

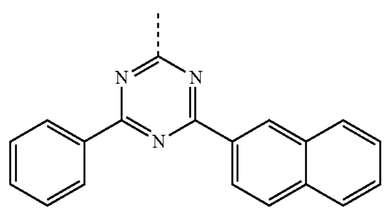

The linking group includes a linking base unit and a substituent connected to the linking base unit. Atoms in the linking base unit are located in a third plane M3 (as shown in FIG. 5). The linking group is any one of substituted or unsubstituted divalent aryl, substituted or unsubstituted divalent heteroaryl, substituted or unsubstituted divalent fused aryl, and substituted or unsubstituted divalent fused heteroaryl.

For example, the linking group L is of any one of the structures shown in the following Formulas 9 to 12.

Formula 9

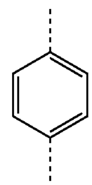

Formula 10

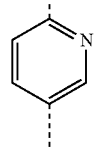

Formula 11

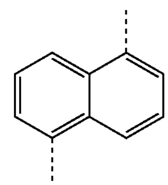

Formula 12

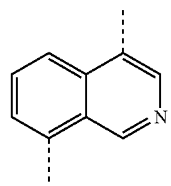

In these embodiments, in a case where the TADF material is selected from the above structural formulas, it is found through experiments that the first plane M1, the second plane M2 and the third plane M3 in the above structural formulas satisfy a certain angular relationship. Moreover, through an orbital simulation of the above structural formulas, it is found that an degree of overlapping between the highest occupied molecular orbital (HOMO) and the lowest unoccupied molecular orbital (LUMO) of the TADF material is small, and thus an energy difference ΔEST between the singlet excitons and the triplet excitons of the obtained TADF material is small. Therefore, the triplet excitons may be converted into the singlet excitons through reverse inter-system crossing due to the thermal activation, so that the utilization rate of excitons and the luminous efficiency may be improved.

In some embodiments, in a case where the TADF serves as the host material, and the guest material is of a structure shown in any one of the above Formulas 13 to 15, a mass proportion of the guest material in the light-emitting layer 120 is within a range of 1% to 10%, inclusive. In a case where the mass proportion of any one of the above guest materials in the light-emitting layer 120 is within the range of 1% to 10%, inclusive, the luminous efficiency may be improved.

In some embodiments, in a case where the host material is the TADF material and the guest material is the material shown in the Formula 15, a ratio between the mass of the TADF material to the mass of the guest material is within a range of 80:20 to 99:1, inclusive, so that the luminous efficiency may be improved.

In some embodiments, a difference ΔE between an energy of the triplet excitons of the host material and an energy of the triplet excitons of the guest material is greater than or equal to 0.65 eV (ΔE≥0.65 eV). The energy of the triplet excitons may be confined in the guest material, so that the guest material emits light better. The energy of the triplet excitons of the host material and the energy of the triplet excitons of the guest material may be measured at a temperature of 77 K.

FIG. 5 is a schematic diagram showing an angle between the donor D and the linking group L and an angle between the linking group L and the acceptor A of the TADF material provided by some embodiments. For convenience of description, for example, the donor D is taken from the structure of Formula 1, the acceptor A is taken from the structure of Formula 7, and the linking group L is taken from the structure of Formula 9.

In some embodiments, as shown in FIG. 5, a value of an included angle θ1 between the first plane M1 and the third plane M3 is greater than or equal to 50° and is less than or equal to 80° (50°≤θ1≤80°). By confining the included angle θ1 between the first plane M1 and the third plane M3 within the above range, it is found through experiments that, the degree of overlapping between the highest occupied molecular orbital (HOMO) and the lowest unoccupied molecular orbital (LUMO) of the TADF material may be further reduced, so that the energy level difference ΔEST between the singlet excitons and the triplet excitons is reduced, and the TADF material with a small energy level difference between the singlet excitons and the triplet excitons may be obtained.

In some embodiments, as shown in FIG. 5, it is found through experiments that, a value of an included angle θ2 between the second plane M2 and the third plane M3 is greater than or equal to 0° and is less than or equal to 80° (0°≤θ2≤80°). By confining the included angle θ2 between the second plane M2 and the third plane M3 within the above range, it is found through experiments that, the degree of overlapping between the highest occupied molecular orbital (HOMO) and the lowest unoccupied molecular orbital (LUMO) of the TADF material may further be reduced, so as to reduce the energy level difference ΔEST between the singlet excitons and the triplet excitons.

The embodiments of the present disclosure do not limit the manner of acquiring θ1 and θ2. For example, information about the first plane M1, the second plane M2 and the third plane M3 may be obtained through a molecular dynamic simulation and a DFT simulation, so as to obtain the included angle θ1 between the first plane M1 and the third plane M3, and the included angle θ2 between the second plane M2 and the third plane M3.

In some embodiments, the energy level difference ΔEST between the singlet excitons and the triplet excitons of the TADF material is less than 0.2 eV. By confining the energy level difference ΔEST between the singlet excitons and the triplet excitons in the TADF material within the above range, the utilization rate of the triplet excitons may be further increased, so that the TADF material has high internal quantum efficiency (IQE).

In some embodiments, the TADF material may be any one of Compounds 1 to 4.

Compound 1

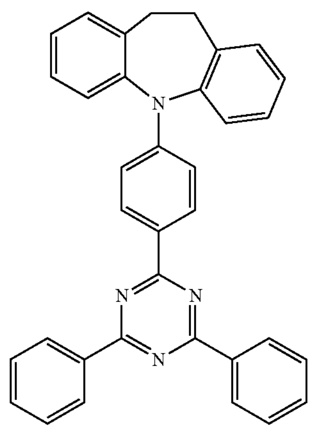

Compound 2

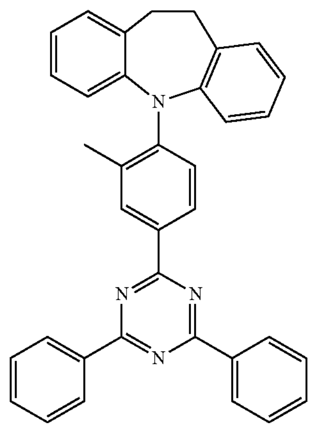

Compound 3

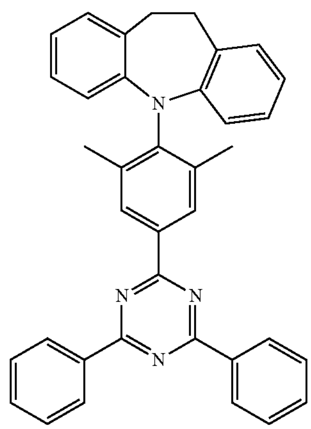

-continued

Compound 4

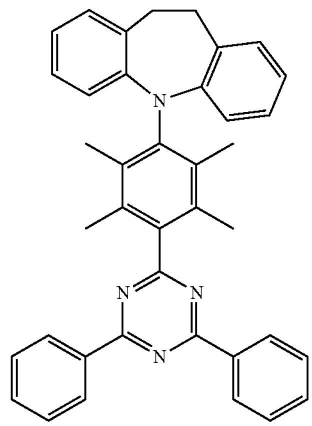

By performing the molecular dynamic simulation and the DFT simulation on the above Compounds 1 to 4, the angle θ1 between the donor D and the linking group L, and the angle θ2 between the linking group L and the acceptor A of each of the above Compounds may be obtained, and information such as the energy level difference ΔEST between the singlet excitons and the triplet excitons of each of the above Compounds may be obtained. The specific simulation results are shown in Table 1.

A steric configuration of Compound 1 is shown in the following formula (i), a steric configuration of Compound 2 is shown in the following formula (ii), a steric configuration of Compound 3 is shown in the following formula (iii), and a steric configuration of Compound 4 is shown in the following formula (iv).

(i)

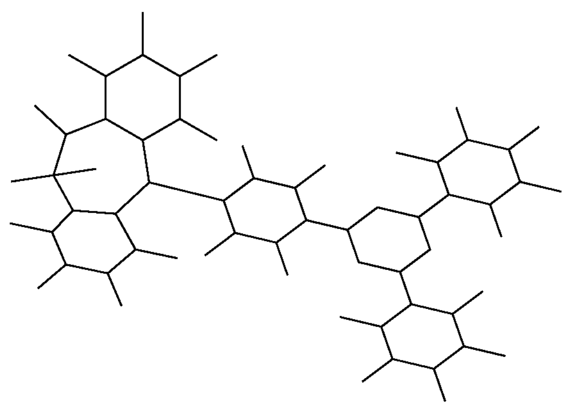

(ii)

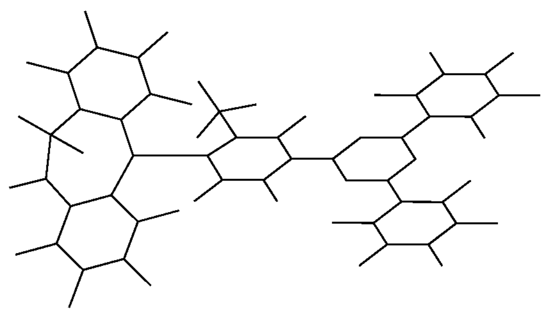

-continued (iii)

(iv)

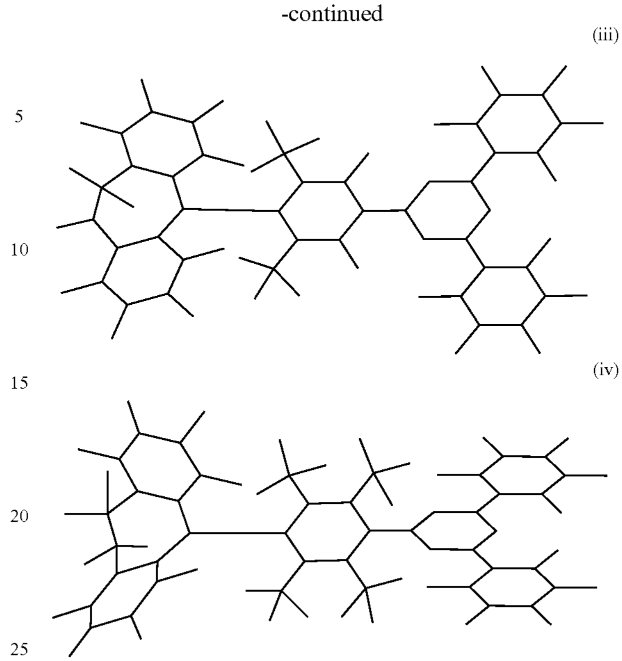

Referring to Table 1 and in combination with FIGS. 6, 7, 8 and 9, the angle θ1 between the donor D and the linking group L, the angle θ2 between the acceptor A and the linking group L, the energy level difference ΔEST between the singlet excitons and the triplet excitons, and the external quantum efficiency (EQE) of Compound 1, Compound 2, Compound 3 and Compound 4 are described, respectively.

Figure 6:
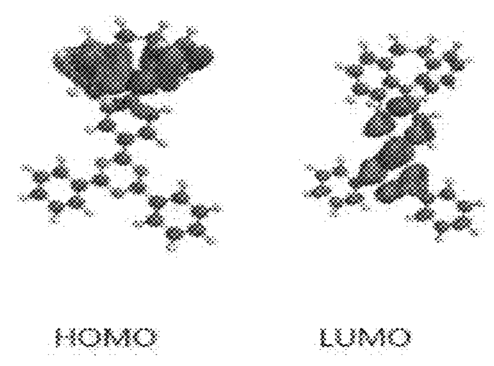
FIG. 6 is a distribution diagram of the highest occupied molecular orbital (HOMO) and the lowest unoccupied molecular orbital (LUMO) of Compound 1, in accordance with some embodiments.

It can be seen from Table 1 that, of Compound 1, the angle θ1 between the donor D and the linking group L is 71.8°, the angle θ2 between the acceptor A and the linking group L is 0.3°, and the energy level difference ΔEST between the singlet excitons and the triplet excitons is only 0.138 eV. As shown in FIG. 6, the highest occupied molecular orbital (HOMO) of Compound 1 only slightly overlaps with the lowest unoccupied molecular orbital (LUMO) of Compound 1. It can be seen that the triplet excitons of Compound 1 may easily return to the singlet state through reverse intersystem crossing, and then transition to a ground state through radiation to emit light, so that the external quantum efficiency (EQE) of the light-emitting device 100 is increased to 6.8%.

Figure 7:
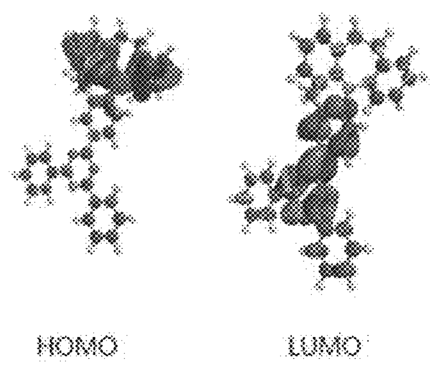
FIG. 7 is a distribution diagram of the highest occupied molecular orbital (HOMO) and the lowest unoccupied molecular orbital (LUMO) of Compound 2, in accordance with some embodiments.

Of Compound 2, the angle θ1 between the donor D and the linking group L is 76.4°, the angle θ2 between the acceptor A and the linking group L is 0.6°, and the energy level difference ΔEST between the singlet excitons and the triplet excitons is only 0.112 eV. As shown in FIG. 7, the highest occupied molecular orbital (HOMO) of Compound 2 only slightly overlaps with the lowest unoccupied molecular orbital (LUMO) of Compound 2. It can be seen that the triplet excitons in Compound 2 may easily return to the singlet state through reverse intersystem crossing, and then transition to the ground state through radiation to emit light, so that the external quantum efficiency (EQE) of the light-emitting device 100 is increased to 12.3%.

Figure 8:
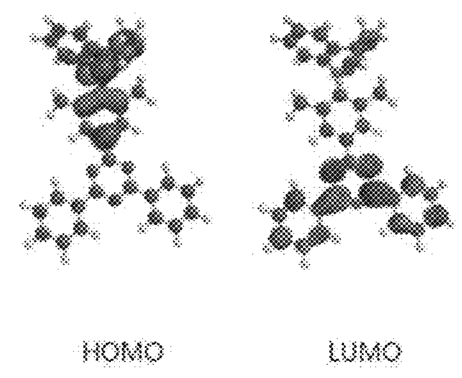
FIG. 8 is a distribution diagram of the highest occupied molecular orbital (HOMO) and the lowest unoccupied molecular orbital (LUMO) of Compound 3, in accordance with some embodiments.

Of Compound 3, the angle θ1 between the donor D and the linking group L is 78.4°, the angle θ2 between the acceptor A and the linking group Lis 0.7°, and the energy level difference ΔEST between the singlet excitons and the triplet excitons is only 0.094 eV. As shown in FIG. 8, the highest occupied molecular orbital (HOMO) of Compound 3 only slightly overlaps with the lowest unoccupied molecular orbital (LUMO) of Compound 3. It can be seen that the triplet excitons in Compound 3 may easily return to the singlet state through reverse intersystem crossing, and then transition to the ground state through radiation to emit light, so that the external quantum efficiency (EQE) of the light-emitting device 100 is increased to 28.3%.

Figure 9:
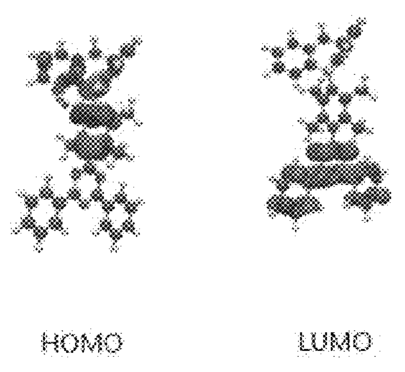
FIG. 9 is a distribution diagram of the highest occupied molecular orbital (HOMO) and the lowest unoccupied molecular orbital (LUMO) of Compound 4, in accordance with some embodiments.

Of Compound 4, the angle θ1 between the donor D and the linking group Lis 78°, the angle θ2 between the acceptor A and the linking group Lis 79.2°, and the energy level difference ΔEST between the singlet excitons and the triplet excitons is only 0.002 eV. As shown in FIG. 9, the highest occupied molecular orbital (HOMO) of Compound 4 only slightly overlaps with the lowest unoccupied molecular orbital (LUMO) of Compound 4. It can be seen that the triplet excitons in Compound 4 may easily return to the singlet state through reverse intersystem crossing, and then transition to the ground state through radiation to emit light, so that the external quantum efficiency (EQE) of the light-emitting device 100 is increased to 16.4%.

In summary, for any one of Compound 1, Compound 2, Compound 3 and Compound 4, the angle θ1 between the donor D and the linking group L is within the range of 50° to 80°, inclusive (50°≤θ1≤80°), and the angle θ2 between the acceptor A and the linking group L is within the range of 0° to 80°, inclusive (0°≤θ2≤80°), and the energy level difference ΔEST between the singlet excitons and the triplet excitons is less than 0.2 eV, so that the degree of overlapping between the highest occupied molecular orbital (HOMO) and the lowest unoccupied molecular orbital (LUMO) is small, and even the separation is achieved. Therefore, the triplet excitons may easily return to the singlet state through inverse intersystem crossing, and then transition to the ground state through radiation to emit light, so that the external quantum efficiency (EQE) of the light-emitting device 100 is greatly improved (an external quantum efficiency (EQE) of the light-emitting device in the related art is 5%).

TABLE 1

| Compound | PL (nm) | θ1 | θ2 | ΔEST (meV) | EQE |
|---|---|---|---|---|---|
| Compound 1 | 472 | 71.8 | 0.3 | 138 | 6.8% |
| Compound 2 | 478 | 76.4 | 0.6 | 112 | 12.3% |
| Compound 3 | 472 | 78.4 | 0.7 | 94 | 28.3% |
| Compound 4 | 456 | 78 | 79.2 | 2 | 16.4% |

Figure 10:
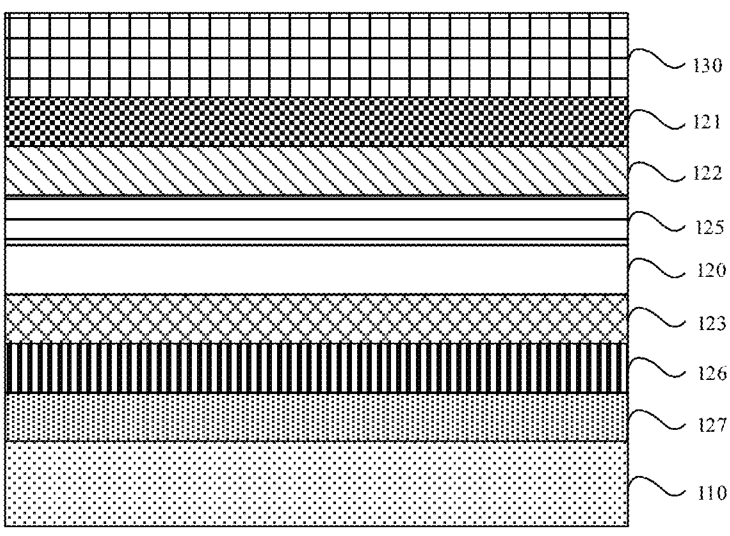
FIG. 10 is a structural diagram of another light-emitting device, in accordance with some embodiments.

As shown in FIG. 10, in addition to the light-emitting layer 120, the light-emitting device 100 may further include at least one of a hole injection layer (HIL) 127, a hole transport layer (HTL) 126, an electron barrier layer (EBL) 123, a hole barrier layer (HBL) 125, an electron transport layer (ETL) 122 and an electron injection layer (EIL) 121. In a case where the light-emitting device 100 includes all of the above layers, the hole injection layer 127, the hole transport layer 126, the electron barrier layer 123, the light-emitting layer 120, the hole barrier layer 125, the electron transport layer 122 and the electron injection layer 121 are sequentially stacked on the first electrode 110, which serves as the anode.

The embodiments of the present disclosure do not limit a material of forming the electron injection layer 121, as long as the material used to form the electron injection layer 121 and the thickness of the electron injection layer 121 can reduce the injection barrier of electrons. For example, the material of the electron injection layer 121 is lithium fluoride (LiF), ytterbium (Yb), or is of quinolinolato lithium (8-hydroxy-quinolinolato lithium (LIQ) shown in Formula 16 below.

Formula 16

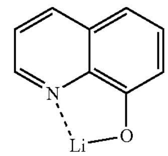

The embodiments of the present disclosure do not limit a material of forming the electron transport layer 122, as long as the material used to form the electron transport layer 122 can improve the transport property of the electrons. For example, the material of the electron transport layer 122 is of a structure shown in any one of the following Formulas 17 to 20.

Formula 17

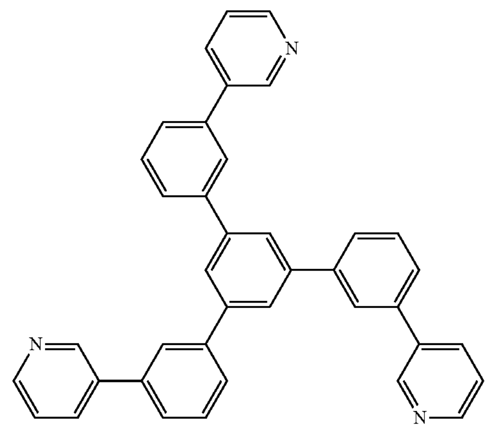

Formula 18

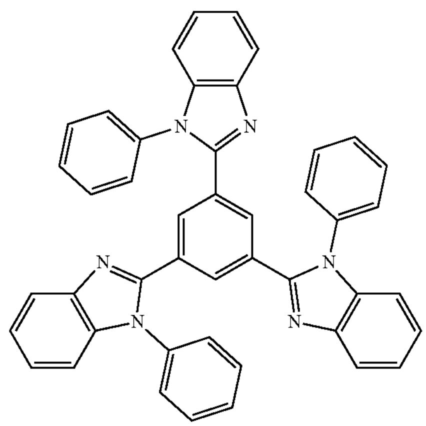

Formula 19

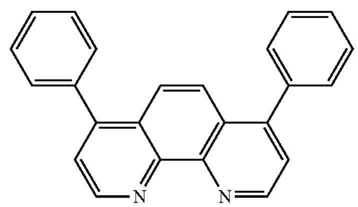

-continued

Formula 20

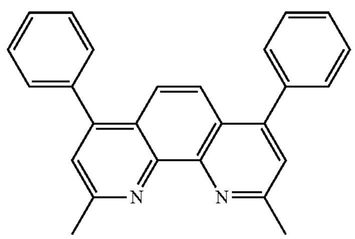

The embodiments of the present disclosure do not limit a material of constituting the electron barrier layer 123, as long as the material used to form the electron barrier layer 123 can block the transport property of the electrons. For example, the material of the electron barrier layer 123 is of a structure shown in any one of the following Formulas 21 to 22.

Formula 21

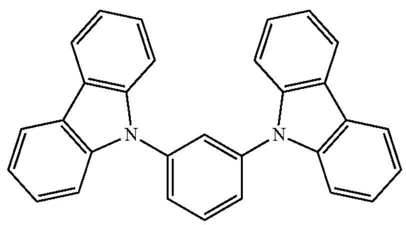

Formula 22

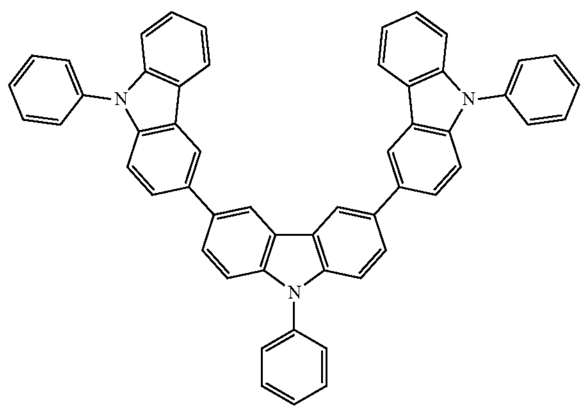

The embodiments of the present disclosure do not limit a material of forming the hole barrier layer 125, as long as the material used to form the hole barrier layer 125 can block the transport property of the holes. For example, the material of the hole barrier layer 125 is of a structure shown in any one of the following Formulas 28 to 30.

Formula 28

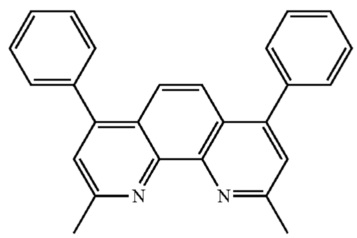

Formula 29

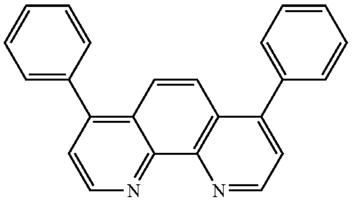

Formula 30

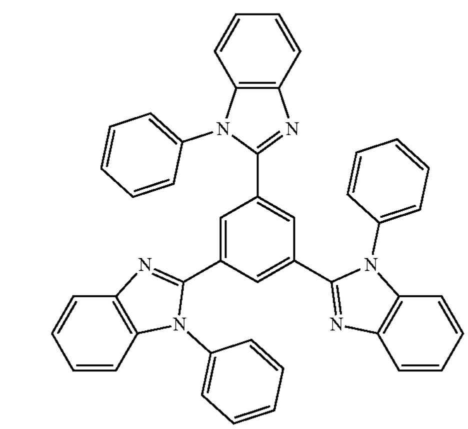

The embodiments of the present disclosure do not limit a material of forming the hole transport layer 126, as long as the material used to form the hole transport layer 126 can improve the transport property of the holes. For example, the material of the electron transport layer 126 is of a structure shown in any one of the following Formulas 23 to 25.

Formula 23

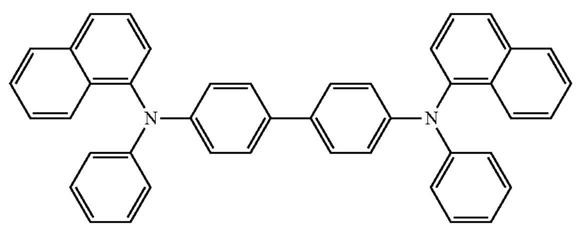

-continued

Formula 24

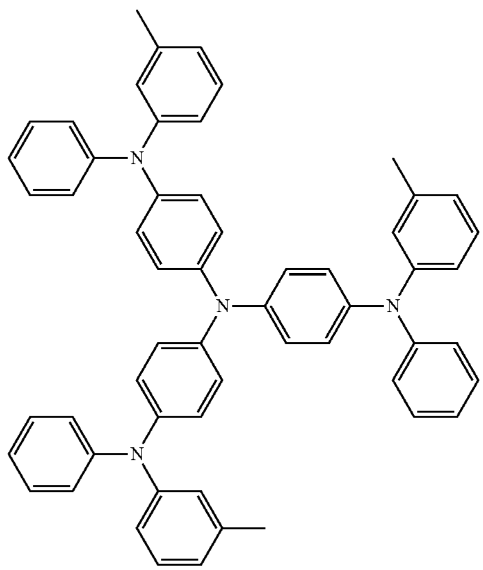

Formula 25

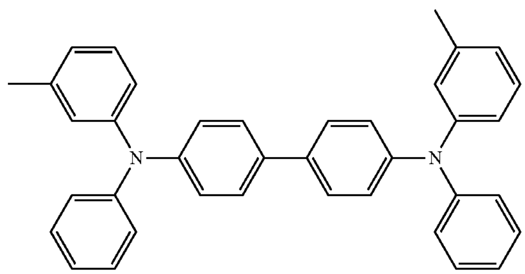

The embodiments of the present disclosure do not limit a material of forming the hole injection layer 127, as long as the material used to form the hole injection layer 127 can reduce the injection barrier of holes. For example, the material of the hole injection layer 127 may be molybdenum trioxide-titanium dioxide ($MoO_3$), or is of a structure shown in any one of the following Formulas 26 to 27.

Formula 26

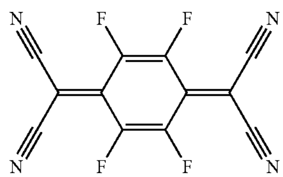

Formula 27

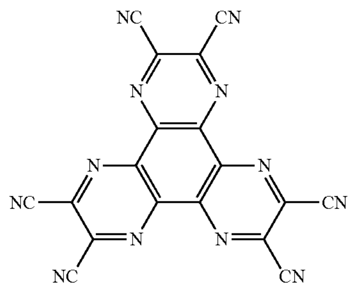

In some embodiments, a range of a thickness of each layer in the light-emitting device 100 is different. For example, a thickness of the electron injection layer 121 may be in a range of 1 to 3 nm, a thickness of the electron transport layer 122 may be in a range of 20 to 35 nm, a thickness of the electron barrier layer 123 may be in a range of 10 to 80 nm, a thickness of the light-emitting layer 120 may be in a range of 20 to 40 nm, a thickness of the hole barrier layer 125 may be in a range of 5 to 10 nm, a thickness of the hole transport layer 126 may be in a range of 1000 to 1300 nm, and a thickness of the hole injection layer 127 may be in a range of 5 to 60 nm. If the thickness of each layer varies within the respective range mentioned above, the color of the emitted light will vary within a same color system. In an example in which the color of light emitted by the light-emitting layer 120 is red and the thickness of the electron transport layer 122 is 30 nm, if the thickness of the electron transport layer 122 changes from 30 nm to 25 nm, the color of the light emitted by the light-emitting layer 120 may change from red to light red; accordingly, if the thickness of the electron transport layer 122 changes from 30 nm to 33 nm, the color of the light emitted by the light-emitting layer 120 may change from red to deep red.

Figure 11:
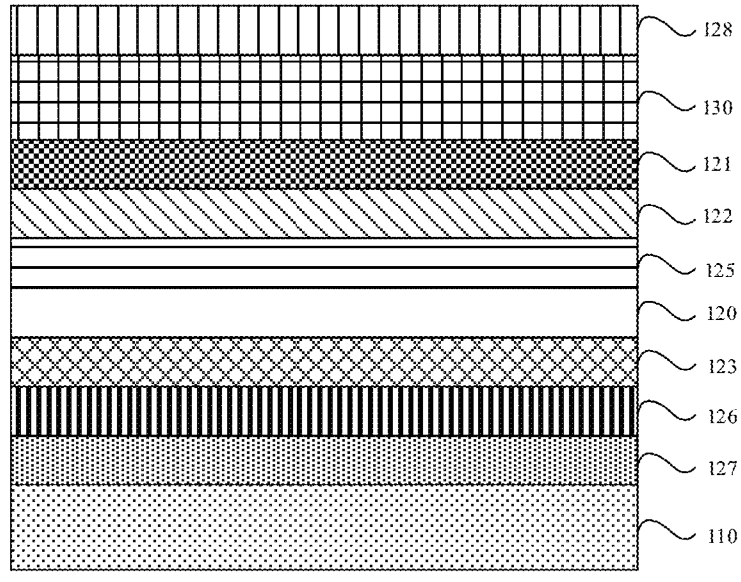
FIG. 11 is a structural diagram of yet another light-emitting device, in accordance with some embodiments.

In some embodiments, as shown in FIG. 11, the OLED light-emitting device 100 further includes a light extraction layer (CPL) 128. By arranging the light extraction layer 128, a light extraction efficiency of the OLED light-emitting device may be increased.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the scope of the present disclosure shall be subject to the protection scope of the claims.

What is claimed is:

1. A light-emitting device, comprising:

a first electrode and a second electrode that are stacked; and a light-emitting layer disposed between the first electrode and the second electrode;

a material of the light-emitting layer including a thermally activated delayed fluorescence (TADF) material; wherein the TADF material includes a donor, an acceptor, and a linking group connected between the donor and the acceptor; the donor includes a donor base unit and a substituent connected to the donor base unit, and atoms in the donor base unit are located in a first plane;

the acceptor includes an acceptor base unit and a substituent connected to the acceptor base unit, and atoms in the acceptor base unit are located in a second plane;

the linking group includes a linking base unit and a substituent connected to the linking base unit, and atoms in the linking base unit are located in a third plane; wherein the donor is of one of structures shown in formula (I):

(I)

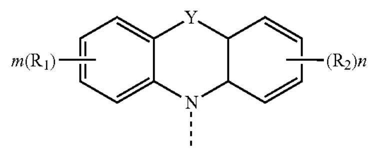

the acceptor is of one of structures shown in formula (II):

(II)

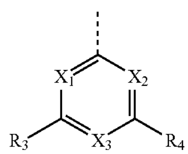

the linking group is any one of substituted or unsubstituted divalent aryl, substituted or unsubstituted divalent heteroaryl, substituted or unsubstituted divalent fused aryl, and substituted or unsubstituted divalent fused heteroaryl;

Y is selected from the group consisting of substituted or unsubstituted divalent aryl, and substituted or unsubstituted divalent heteroaryl;

$R_1$ and $R_2$ are each independently any one of alkyl, aryl, heteroaryl, fused aryl, and fused heteroaryl that are substituted or unsubstituted respectively; m and n are each a positive integer from 0 to 3;

$X_1$, $X_2$ and $X_3$ are each independently selected from any one of C(R) and N, and at least one thereof is N;

$R_3$, $R_4$ and R are each independently any one of hydrogen, cyano, aryl, heteroaryl, fused aryl and fused heteroaryl; and dotted lines in the formula (I) and the formula (II) each represent a linking bond connected to the linking group.

2. The light-emitting device according to claim 1, wherein a value of an included angle between the first plane and the third plane is in a range of 50° to 80°, inclusive.

3. The light-emitting device according to claim 1, wherein a value of an included angle between the second plane and the third plane is in a range of 0° to 80°, inclusive.

4. The light-emitting device according to claim 1, wherein an energy level difference between singlet excitons and triplet excitons in the TADF material is less than 0.2 eV.

5. The light-emitting device according to claim 1, wherein the donor is of any one of structures shown in Formulas 3 and 4

Formula 3

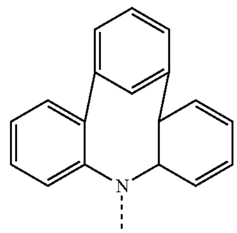

Formula 4

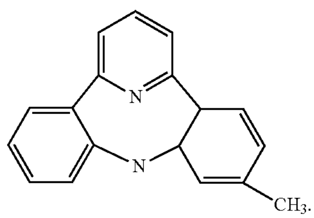

6. The light-emitting device according to claim 1, wherein the acceptor is of any one of structures shown in Formulas 5 to 8

Formula 5

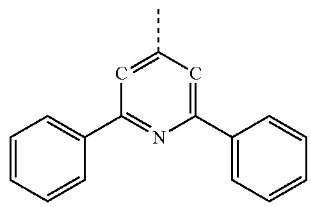

Formula 6

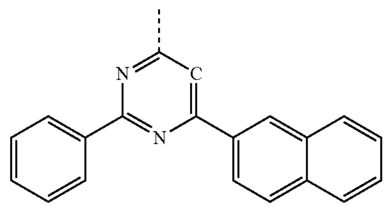

Formula 7

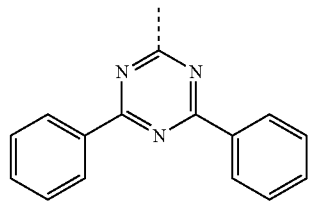

Formula 8

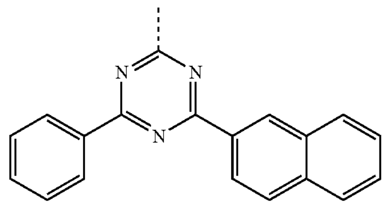

7. The light-emitting device according to claim 1, wherein the linking group is of any one of structures shown in Formulas 9 to 12

Formula 9

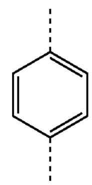

Formula 10

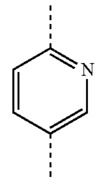

Formula 11

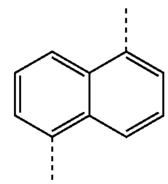

-continued

Formula 12

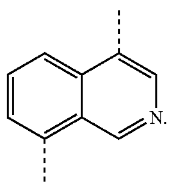

8. The light-emitting device according to claim 1, wherein the material of the light-emitting layer includes a host material and a guest material;

the TADF material serves as the host material, and the guest material is of any one of structures shown in Formulas 13 to 15

Formula 13

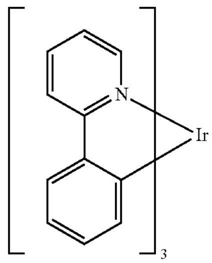

Formula 14

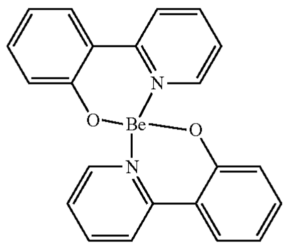

Formula 15

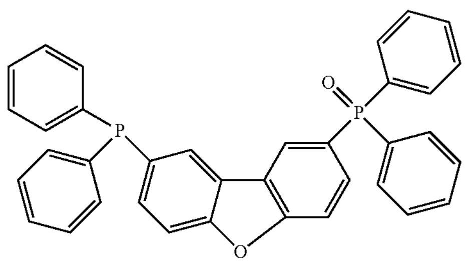

9. The light-emitting device according to claim 8, wherein a mass proportion of the guest material in the light-emitting layer is within a range of 1% to 10%, inclusive.

10. The light-emitting device according to claim 9, wherein a difference between energy of triplet excitons of the host material and energy of triplet excitons of the guest material is greater than or equal to 0.65 eV.

11. The light-emitting device according to claim 1, further comprising at least one of an electron injection layer, an electron transport layer, an electron barrier layer, a hole barrier layer, a hole transport layer and a hole injection layer.

12. The light-emitting device according to claim 11, wherein a material of the electron injection layer is lithium fluoride (LiF), ytterbium (Yb) or is of a structure shown in Formula 16;

Formula 16

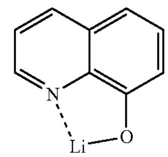

a material of the electron transport layer is of a structure shown in any one of Formulas 17 to 20;

Formula 17

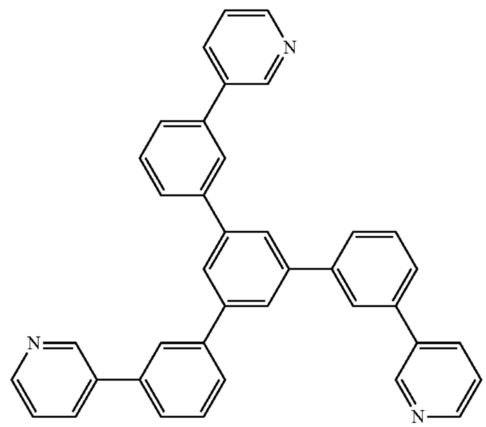

Formula 18

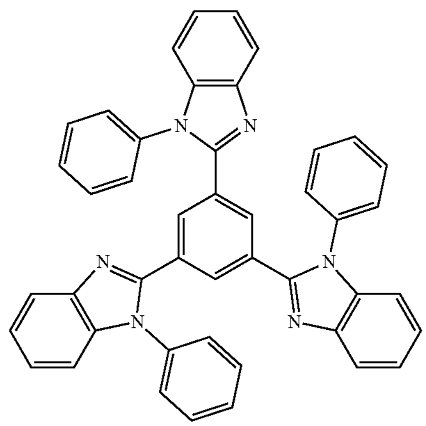

Formula 19

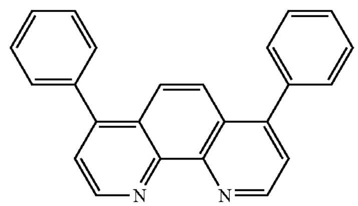

Formula 20

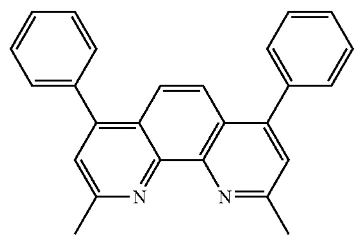

a material of the electron transport layer is of a structure shown in any one of Formulas 21 to 22;

Formula 21

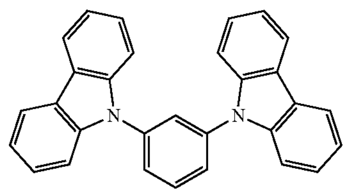

Formula 22

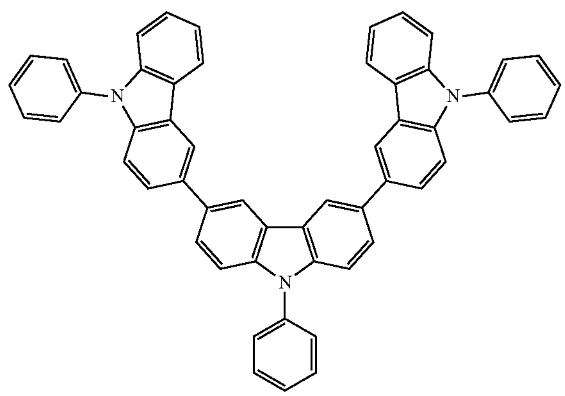

a material of the hole barrier layer is of a structure shown in any one of Formulas 18 to 20;

Formula 18

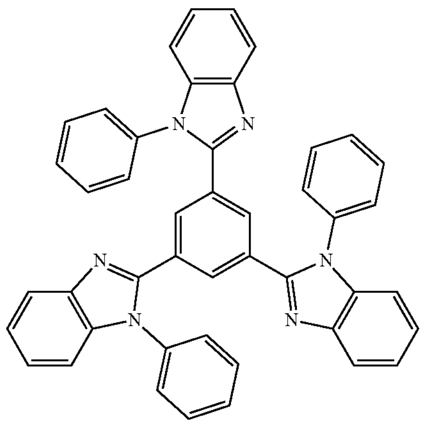

Formula 19

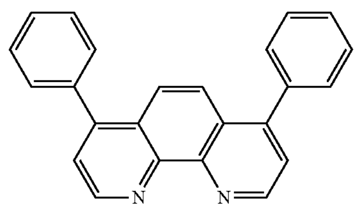

-continued

Formula 20

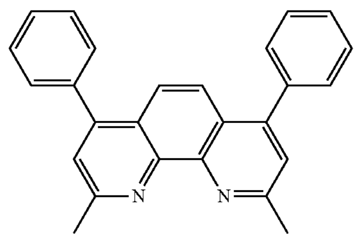

a material of the hole transport layer is of a structure shown in any one of Formulas 23 to 25; and Formula 23

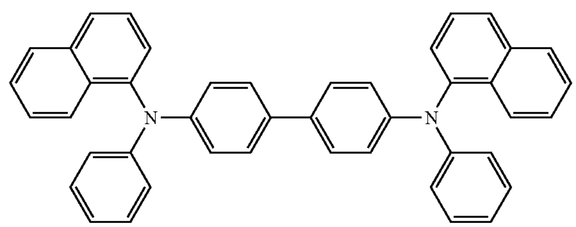

Formula 24

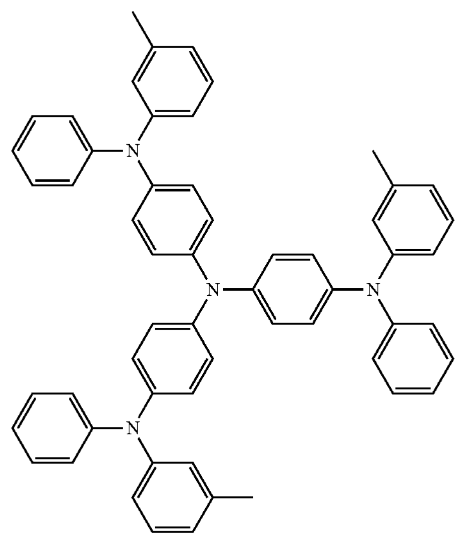

Formula 25

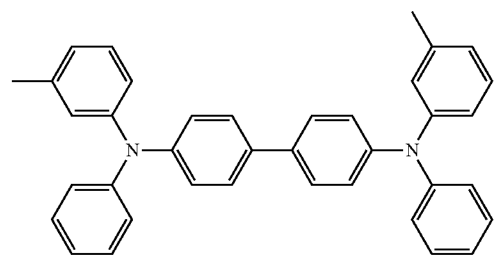

a material of the hole injection layer is of a structure shown in any one of Formulas 26 to 27

Formula 26

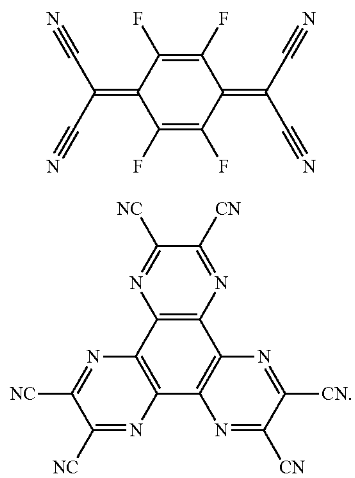

Formula 27

13. A display panel, comprising a base substrate and the light-emitting device disposed on the base substrate according to claim 1.

14. A display device, comprising the display panel according to claim 13.

15. The light-emitting device according to claim 2, wherein a value of an included angle between the second plane and the third plane is in a range of 0° to 80°, inclusive.

16. The light-emitting device according to claim 8, wherein the guest material is of the structure shown in Formulas 15, a ratio between a mass of the TADF material to a mass of the guest material is within a range of 80:20 to 99:1, inclusive.

17. The light-emitting device according to claim 11, further comprising a light extraction layer disposed on the light-emitting layer away from the first electrode or the second electrode.

* * * * *